(12) United States Patent
Nishimura et al.

(10) Patent No.: US 7,402,523 B2
(45) Date of Patent: Jul. 22, 2008

(54) ETCHING METHOD

(75) Inventors: Eiichi Nishimura, Nirasaki (JP); Takehiko Orii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 129 days.

(21) Appl. No.: 11/393,915

(22) Filed: Mar. 31, 2006

(65) Prior Publication Data

US 2006/0219660 A1    Oct. 5, 2006

Related U.S. Application Data

(60) Provisional application No. 60/666,707, filed on Mar. 31, 2005.

(30) Foreign Application Priority Data

Mar. 31, 2005    (JP)    .............................. 2005-102420

(51) Int. Cl.
    *H01L 21/00*    (2006.01)
    *B44C 1/22*    (2006.01)
(52) U.S. Cl. .......................... 438/704; 216/41; 216/57; 216/67; 438/710; 438/745

(58) Field of Classification Search ................... 216/41, 216/57, 67; 438/704
See application file for complete search history.

(56) References Cited

U.S. PATENT DOCUMENTS

| 7,169,440 B2* | 1/2007 | Balasubramaniam et al. .... 427/162 |
| 2003/0040192 A1* | 2/2003 | Kanegae ...................... 438/710 |
| 2003/0155657 A1* | 8/2003 | Tonegawa et al. ........... 257/774 |
| 2004/0009658 A1* | 1/2004 | Aoki et al. .................. 438/629 |

FOREIGN PATENT DOCUMENTS

JP    2005-33027    *    2/2005

* cited by examiner

*Primary Examiner*—Shamim Ahmed
(74) *Attorney, Agent, or Firm*—Oblon, Spivak, McClelland, Maier & Neustadt, P.C.

(57) ABSTRACT

A method for etching an insulation film through a patterned mask, includes the steps of etching the insulation film until just before an underlayer is about to be exposed by applying a plasma, and modifying a quality of a remaining film of the insulation film by applying another plasma which is different from the plasma used in the above etching process. The method further includes the process of removing the modified remaining film of the insulation film with a liquid chemical. The process of removing the modified remaining film can be also achieved by a dry etching method not employing a plasma.

18 Claims, 6 Drawing Sheets

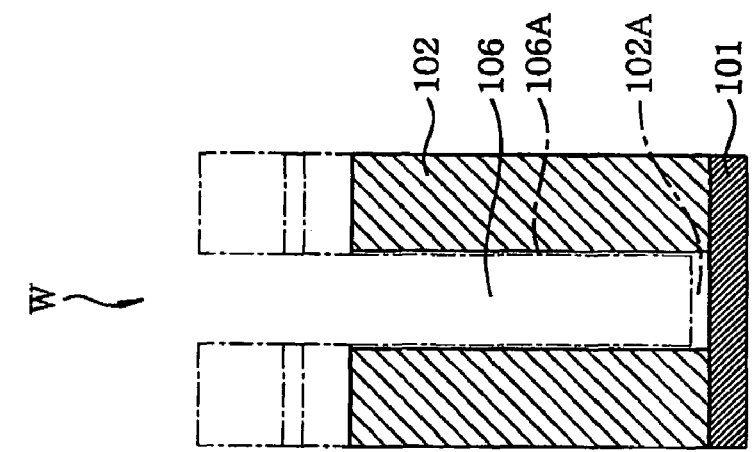
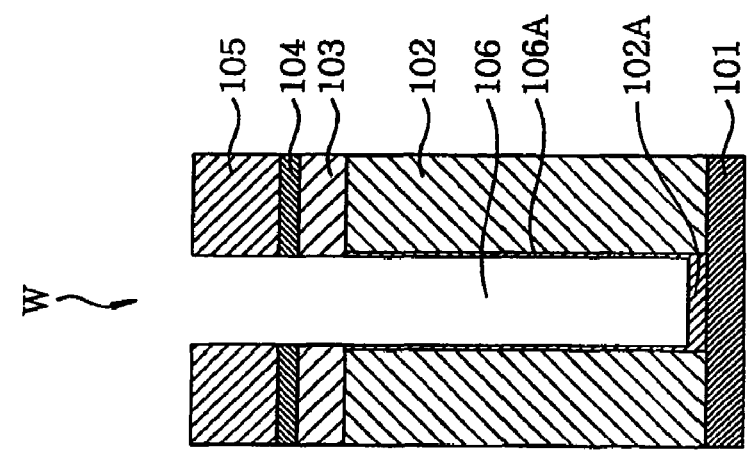
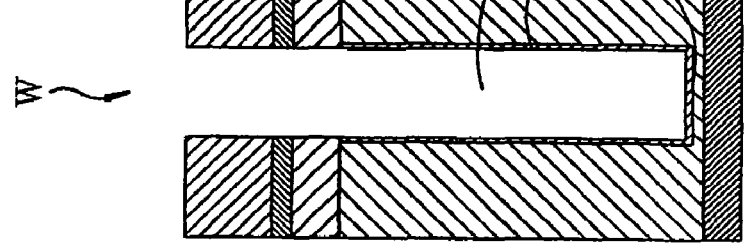

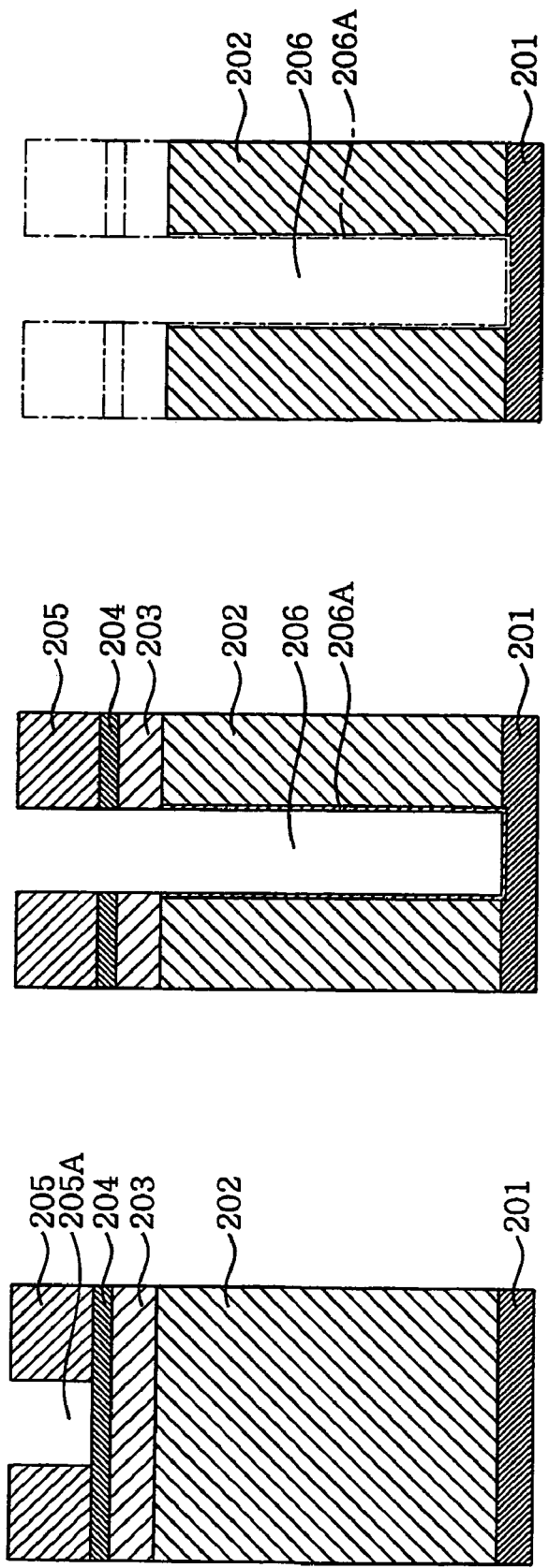

ETCHING METHOD

FIELD OF THE INVENTION

The present invention relates to an etching method for forming an opening such as a contact hole or the like on an insulation film, and, more particularly, to an etching method capable of etching an insulation film exclusively without damaging an underlayer of a wafer.

BACKGROUND OF THE INVENTION

In order to form a hole as a contact hole on an insulation film or the like, a plasma processing apparatus performs a dry etching such as a high anisotropic reactive ion etching or the like. FIG. 6 shows a case of etching an object to be processed, e.g., a wafer in which an insulation film 202, a hard mask 203 formed of $SiO_2$ or the like, an anti-reflection coating 204 and a resist film 205 are laminated on an underlayer 201 in order.

First of all, as depicted in FIG. 6A, an opening 205A is formed in the resist film 205 by employing a photolithography process. Next, as illustrated in FIG. 6B, a dry etching is performed on the anti-reflection coating 204, the hard mask 203 and the insulation film 202 by using the resist film 205 as a mask until the underlayer 201 is exposed, thereby forming an opening 206. During the dry etching, the underlayer 201 as well as a sidewall of the opening 206 is irradiated by reactive ions or the like. Accordingly, the underlayer 201 is damaged as depicted in FIG. 6B and, further, the damage inflicted on the underlayer 201 hinders a wiring process or the like to be performed.

As described in FIG. 6C, a defective layer 206A has been removed through a conventional wet etching process. However, in case of the wet etching process, since it is difficult to find out the exact thickness of the defective layer 206A to be removed, it is very difficult to precisely remove only the defective layer 206A and, thus, a surface of the underlayer 201 tends to be overetched, thereby deteriorating a fabrication accuracy. Therefore, there is suggested a technique for removing the defective layer 206A while maintaining the fabrication accuracy for forming the opening 206 to the utmost in Japanese Patent Application Nos. H05-182871, H07-167680 and H08-144008 (hereinafter, referred to as Patent documents 1 to 3).

For example, the Patent document 1 suggests a semiconductor device fabrication method involving forming an insulation film on an underlayer of a wafer, dry etching the insulation film by applying a patterned resist film as a mask, exposing the underlayer through an opening generated by dry etching, forming a selective oxide layer by oxidizing a defective layer formed on a surface of the underlayer during the dry etching process, and removing the selective oxide layer by a wet etching. In this method, while the defective layer formed on the surface of the underlayer is removed, an overetching onto the underlayer is suppressed by converting the defective layer into the selective oxide layer by oxidizing it first before it is removed.

The Patent document 2 suggests a semiconductor device fabrication method involving a first plasma etching process in which a part of an inter-layer insulation film is etched along a thickness direction thereof until a surface of a device area is about to be exposed and a second plasma etching process in which a remaining part of the inter-layer insulation film in the thickness direction thereof is etched by a gas capable of generating halogen-based chemical species other than fluorine-based chemical species. In this method, the etching is performed by using the gas capable of generating halogen-based chemical species other than fluorine-based chemical species, thereby suppressing carbon or fluorine contamination on the device area or a generation of a defective layer thereon.

The Patent document 3 suggests a semiconductor device fabrication method involving dry etching an insulation film formed on an underlayer of a wafer, and removing a defective layer formed on the surface of the underlayer by irradiating accelerated oxygen ions thereon through an opening of the insulation film. In this method, since fluorine is not used for removing the defective layer, the surface of the underlayer is not etched. As a result, irregularities are not generated on the surface of the underlayer.

In the conventional method of the Patent document 1, the insulation film is dry etched until the silicon underlayer is exposed and the defective layer formed on the silicon underlayer is oxidized and converted into a selective oxide layer and, then, the selective oxide layer is wet etched. Accordingly, in case an underlayer or a device area is formed on the surface of the silicon substrate, an etching selectivity of the insulation film against the underlayer or the device region can be low during the dry etching process, and, further, the defective layer formed on the surface of the underlayer or the device area is removed by the wet etching. Therefore, it is possible to precisely and exclusively etch the insulation film only, resulting in the erosion of the underlayer or the device area.

Meanwhile, the underlayer keeps getting thinner along with a trend for high integration and high density of a semiconductor device. For example, a film thickness currently ranging from 50 nm to 100 nm is expected to be reduced to range from 20 nm to 30 nm in a near future. Therefore, with the etching method of the Patent document 1, it is not possible to cope with the trend for the thinner semiconductor underlayer.

Further, in the conventional method of the Patent document 2, the etching is performed by using the gas capable of generating halogen-based chemical species other than fluorine-based chemical species, thereby enabling to suppress carbon or fluorine contamination on the device area or a generation of a defective layer thereon. However, it is not possible to completely prevent the contamination from the halogen-based chemical species (elements such as Cl, Br or the like) and the generation of the defective layer. Consequently, with the etching method of the Patent document 2, it is not possible to cope with the trend for the thinner underlayer.

Furthermore, in the conventional method of the Patent document 3, since the defective layer formed on the surface of the underlayer is removed by irradiating accelerated oxygen ions thereon, energy of the oxygen ions should be precisely controlled such that the surface of the underlayer is not etched by the oxygen ions.

SUMMARY OF THE INVENTION

It is, therefore, an object of the present invention to provide an etching method capable of etching an insulation film exclusively with high accuracy without damaging a semiconductor even while underlayer keeps getting thinner along with the trend for high density and high integration of a semiconductor device.

In accordance with a preferred embodiment of the present invention, there is provided a method for etching an insulation film through a patterned mask, the method includes, a first process of etching the insulation film until just before an underlayer is about to be exposed by applying a first plasma of a first processing gas;

a second process of modifying a quality of a remaining film of the insulation film by applying a second plasma of a second processing gas, the second plasma being different from the first plasma; and a third process of removing the insulation film having a modified film quality with a liquid chemical.

In accordance with another preferred embodiment of the present invention, there is provided a method for etching an insulation film through a patterned mask, the method includes, a first process of etching the insulation film until just before an underlayer is about to be exposed by applying a first plasma of a first processing gas;

a second process of modifying a quality of a remaining film of the insulation film by applying a second plasma of a second processing gas, the second plasma being different from the first plasma; and a third process of removing the insulation film having a modified film quality through a dry etching process using no plasma.

Preferably, the insulation film is a SiCOH-based low dielectric constant insulation film.

Preferably, the mask is a hard mask.

Preferably, the first processing gas is fluorocarbon gas.

Preferably, in the second process, a methyl group is mainly removed from the SiCOH-based low dielectric constant insulation film.

Preferably, the second processing gas contains at least $H_2$ gas or $O_2$ gas.

Preferably, the liquid chemical contains at least one of hydrofluoric acid, ammonium fluoride and tetramethyl ammonium hydroxide.

Preferably, the dry etching process using no plasma employs a chemical oxide removal method.

Preferably, the underlayer is formed of SiC or SiCN.

In accordance with still another preferred embodiment of the present invention, there is provided a method for etching a SiCOH-based low dielectric constant insulation film, the method includes, a first process of etching the SiCOH-based low dielectric constant insulation film with a fluorocarbon gas plasma without exposing an underlayer such that a thickness of a remaining SiCOH-based low dielectric constant insulation film is smaller than or equal to 100 nm;

a second process of removing a methyl group from the remaining SiCOH-based low dielectric constant insulation film by applying a plasma containing $H_2$ gas or $O_2$ gas; and a third process of removing the remaining SiCOH-based low dielectric constant insulation film devoid of the methyl group with a solution containing at least one of hydrofluoric acid, ammonium fluoride and tetramethyl ammonium hydroxide.

BRIEF DESCRIPTION OF THE DRAWINGS

The above and other objects and features of the present invention will become apparent from the following description of preferred embodiments, given in conjunction with the accompanying drawings, in which:

FIGS. 4A to 4C present cross sectional views of the principal parts of the wafer, which respectively depict a process for etching the low-k film with the plasma processing apparatus of FIG. 1, a process for modifying a quality of the remaining film of the low-k film, and a process for removing a defective layer with the liquid chemical processor shown in FIG. 2 after the modification;

FIGS. 6A to 6C represent sectional views of principal parts of a wafer, which show processes for etching a low-k film with a conventional etching method.

DETAILED DESCRIPTION OF THE PREFERRED EMBODIMENT

Figure 1:
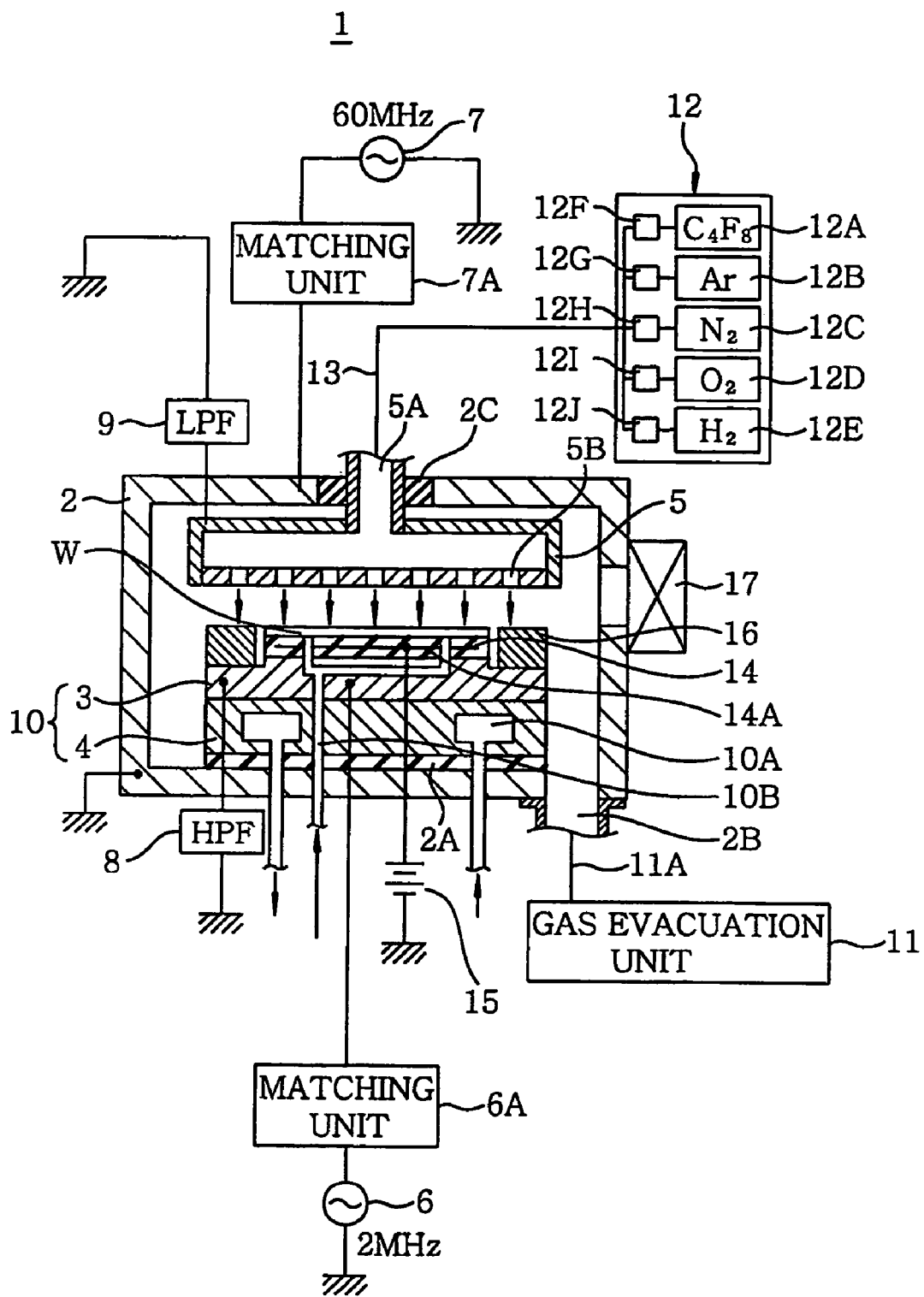
FIG. 1 shows an exemplary plasma processing apparatus used for an etching method of the present invention.

Hereinafter, preferred embodiments of the present invention will be described in detail with reference to FIGS. 1 to 5.

In an etching method of the present invention, an insulation film 102 formed on an object (e.g., a wafer) is etched to form an opening 106 by using a plasma processing apparatus 1 (see, FIG. 1) until an underlayer 101 thereof is about to be exposed, that is, until a part of the insulation film 102 still remains to be left. Thereafter, a quality of a remaining film 102A of the insulation film 102 is modified by using the same plasma processing apparatus 1.

Next, the modified remaining film 102A of the insulation film 102 is subjected to a liquid chemical process using a liquid chemical processor 20 (see, FIG. 2), so that the remaining film 102A of the insulation film 102 can be precisely and exclusively removed without damaging the underlayer 101. Hereinafter, the plasma processing apparatus 1 and the liquid chemical processor 20 will be explained and, then, a first preferred embodiment of the etching method of the present invention will be described.

The plasma processing apparatus 1 used for the etching method of the present invention includes an electrically grounded processing chamber 2 having an alumite processed surface, which can be maintained at a desired high vacuum level; a lower electrode 3 disposed at a central portion of a bottom surface of the processing chamber 2, for mounting thereon a wafer W; a support 4 provided on an insulation plate 2A on the bottom surface of the processing chamber 2, for supporting the lower electrode 3 from below; and a hollow upper electrode 5 spaced apart from the lower electrode 3. Such plasma processing apparatus 1 is configured to etch an insulation film of the wafer until an underlayer is about to be exposed and then modify a remaining film of the etched insulation film.

A first high frequency power supply 6 of, e.g., 2 MHz, is connected to the lower electrode 3 via a matching unit 6A, whereas a second high frequency power supply 7 having a frequency, e.g., 60 MHz, higher than that applied to the lower electrode 3 is connected to the upper electrode 5 via a matching unit 7A. Further, a high pass filter 8 is connected to the lower electrode 3, whereas a low pass filter 9 is connected to the upper electrode 5. Moreover, a gas evacuation unit 11 is connected to an evacuation port 2B provided on the bottom surface of the processing chamber 2 via an gas line 11A and maintains the processing chamber 2 at a desired vacuum level by vacuum exhausting the processing chamber 2. Hereinafter, if necessary, the lower electrode 3 and the support 4 will be referred together as a mounting table 10.

A gas supply line 5A is formed at a central portion of a top surface of the upper electrode 5 and is inserted into a central portion of a top surface of the processing chamber 2 via the insulation member 2C. Further, a gas source 12 is connected to the gas supply line 5A via a gas supply line 13 and supplies an etching gas. To be specific, the gas source 12 includes a first gas (e.g., $C_4F_8$) source 12A, a second gas (e.g., Ar) source 12B, a third gas (e.g., $N_2$) source 12C, a fourth gas (e.g., $O_2$) source 12D, a fifth gas (e.g., $H_2$) source 12E, and mass flow controllers (12F, 12G, 12H, 12I and 12J) of the respective gas sources 12A to 12E, wherein the gas sources 12A to 12E are connected to the gas supply line 13 via the mass flow controllers 12F to 12J, respectively.

Moreover, the gas source 12 combines gases from those gas sources 12A to 12E and then supplies the gas mixture into a hollow portion inside the upper electrode 5 at a predetermined flow rate ratio. A plurality of gas injection openings 5B are uniformly distributed on a bottom surface of the upper electrode 5. A plurality of gases introduced from the gas source 12 are mixed and then uniformly supplied as an etching gas or a surface modifying gas into the processing chamber 2 through the gas injection openings 5B.

The processing chamber 2 is vacuum exhausted by the gas evacuation unit 11, and a specific etching gas is supplied thereto from the gas source 12 at a predetermined flow rate. In this state, by applying a high frequency power to the lower and the upper electrode 3 and 5, a plasma of the etching gas (or the surface modifying gas) is generated inside the processing chamber 2 to be used in performing a specific etching or surface modification on the wafer W on the lower electrode 3. A temperature sensor (not shown) is attached to the lower electrode 3 to be used to constantly monitor a temperature of the wafer W on the lower electrode 3.

Formed inside the mounting table 10 is an internal coolant channel 10A where a specific coolant (e.g., a conventionally well known fluorine-based fluid, water or the like) passes through. The lower electrode 3 and the wafer W on the lower electrode 3 are cooled while the coolant is flowing in the internal coolant channel 10A, so that the wafer W is controlled to be maintained at a desired temperature. Further, an electrostatic chuck 14 made of an insulating material is disposed on the lower electrode 3, and a high voltage DC power supply 15 is connected to an electrode plate 14A inside the electrostatic chuck 14. The electrostatic chuck 14 electrostatically adsorbs the wafer W with an electrostatic force generated on a surface by a high voltage applied from the high voltage DC power supply 15 to the electrode plate 14A. A focus ring 16 surrounding the electrostatic chuck 14 is disposed at an outer periphery of the lower electrode 3 to focus the plasma on the wafer W.

Moreover, formed at the mounting table 10 is a gas channel 10B for supplying a thermally conductive gas such as He gas or the like as a backside gas. The gas channel 10B has openings at multiple locations on a top surface of the mounting table 10. Those openings match with through holes formed at the electrostatic chuck 14 on the mounting table 10.

Thus, if the backside gas is supplied to the gas channel 10B of the mounting table 10, the backside gas is discharged through the through holes of the electrostatic chuck 14 via the gas channel 10B to be uniformly diffused into an entire gap between the electrostatic chuck 14 and the wafer W to thereby increase a thermal conductivity in the gap. Further, referring to FIG. 1, there is illustrated a gate valve 17 formed at the processing chamber 2, for allowing the wafer W to be carried into or out of the processing chamber 2.

In the aforementioned plasma processing apparatus 1, the opening 106 is formed on the insulation film 102 by performing the etching process on the wafer W and, then, the quality of the remaining film 102A generated during the etching process in the insulation film 102 is modified. Thereafter, the modified remaining film 102A of the insulation film 102 is removed by a liquid chemical processor 20 to be described later. Accordingly, an etching selectivity of the remaining film 102A against the underlayer 101 becomes infinite. As a result, the remaining film 102A can be exclusively removed without damaging the underlayer 101.

Figure 2:
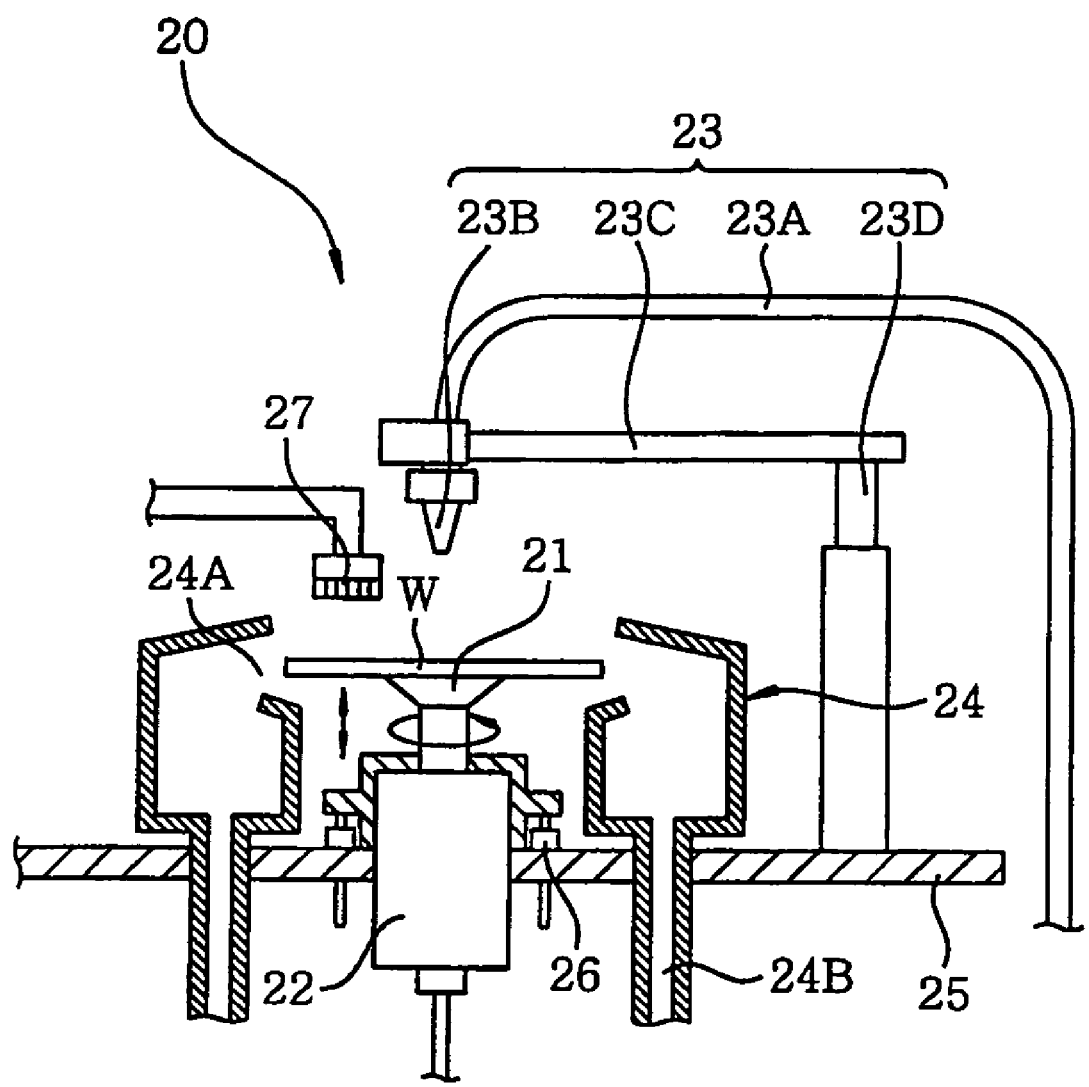
FIG. 2 describes a cross sectional view of an exemplary liquid chemical processor used for removing a remaining film of an etched low-k film.

As shown in FIG. 2, for example, the liquid chemical processor 20 includes a wafer chuck 21 that can be moved up and down, a motor 22 for rotating the wafer chuck 21, a liquid chemical supply unit 23 arranged to be separated from the motor 22, for supplying a liquid chemical to a central portion of a top surface of the wafer W electrostatically adsorbed to be held by the wafer chuck 21, and a ring-shaped receptacle 24 for collecting the liquid chemical dispersed from the surface of the wafer W after the processing. Those components are supported by a support plate 25.

Still referring to FIG. 2, the wafer chuck 21 is lifted up and down by a elevating mechanism 26 surrounding an upper portion of the motor 22. The liquid chemical supply unit 23 includes a liquid chemical supply line 23A connected to a liquid chemical tank (not shown), a nozzle 23B attached to a leading end of the liquid chemical supply line 23A, a supporting arm 23C for supporting the nozzle 23B and a driving body 23D for elevating the supporting arm 23C, wherein the nozzle 23B supplies a liquid chemical to a central portion of the wafer W held by the wafer chuck 21. The liquid chemical supply unit 23 is also used for supplying a cleaning fluid such as pure water or the like. In case the wafer W is cleaned, a cleaning brush 27 disposed above the wafer chuck 21 is used.

Moreover, the ring-shaped receptacle 24 is formed in an approximate doughnut shape, and an opening 24A is formed along an upper portion of an inner peripheral surface, thereby collecting liquid chemical dispersed from the rotating wafer W through the opening 24A after the processing. Further, an exhaust line 24B is formed on a bottom surface of the ring-shaped receptacle 24 which passes through the support plate 25 downwardly, thereby discharging the liquid chemical into a predetermined collection tank (not shown) through the exhaust line 24B after the processing.

Hereinafter, a first preferred embodiment of the etching method of the present invention using the plasma processing apparatus 1 and the liquid chemical processor 20 will be described with reference to FIGS. 3 and 4. In this embodiment, as shown in FIGS. 3A and 3B, an etching process is performed on the wafer W in which an underlayer 101, a SiCOH-based low dielectric constant insulation film (hereinafter, referred to as 'low-k film') 102, a hard mask 103, an anti-reflection coating 104 and a resist film 105 are laminated in order. The underlayer 101 is formed of, e.g., SiC, SiCN or the like. The SiCOH-based low-k film 102 is made of an organic material including Si, C, O and H, e.g., a methylhydrogen-silsesquioxane (MSQ)-based organic material or the like. Further, the hard mask 103 is formed of, e.g., $SiO_2$, $SiN_x$ or the like. Moreover, an opening 105A is formed in advance in the resist film 105 in a specific pattern by a photolithography process.

Once the aforementioned wafer W is supplied to the plasma processing apparatus 1, the gate valve 17 of the plasma processing apparatus 1 is opened and, then, the wafer W is loaded into the processing chamber 2 through the loading/unloading port. When the wafer W is mounted on the lower electrode 3, the wafer W is fixed on the electrostatic chuck 14 by the electrostatic adsorption. After the loading/unloading port is closed by closing the gate valve 17, the first to the third gas source 12A to 12C of the gas source 12 respectively supply $C_4F_8$ gas, Ar gas and $N_2$ gas as etching gases at a predetermined flow rate ratio toward a top surface of the wafer W through the gas injection openings 5B of the upper electrode 5.

At this time, the respective gas flow rates of $C_4F_8$ gas, Ar gas and $N_2$ gas preferably range from 4 sccm to 6 sccm, from 500 sccm to 1000 sccm, and from 100 sccm to 200 sccm, for example. Further, a gas pressure inside the processing chamber 2 preferably ranges from 50 mTorr to 75 mTorr, for example. During the etching process, He gas is supplied to a backside of the wafer W at a controlled flow rate, thereby cooling the wafer W.

If the inner space of the processing chamber 2 is stabilized to be maintained at a predetermined vacuum level, high frequency powers are applied from the first high frequency power supply 6 and the second high frequency power supply 7, respectively, thereby generating a plasma of the etching gases between the lower electrode 3 and the upper electrode 5. The high frequency power applied from the first high frequency power supply 6 preferably ranges from 400 W to 1700 W, for example. Moreover, the high frequency power applied from the second high frequency power supply 7 preferably ranges from 300 W to 1200 W, for example.

Figure 3A:
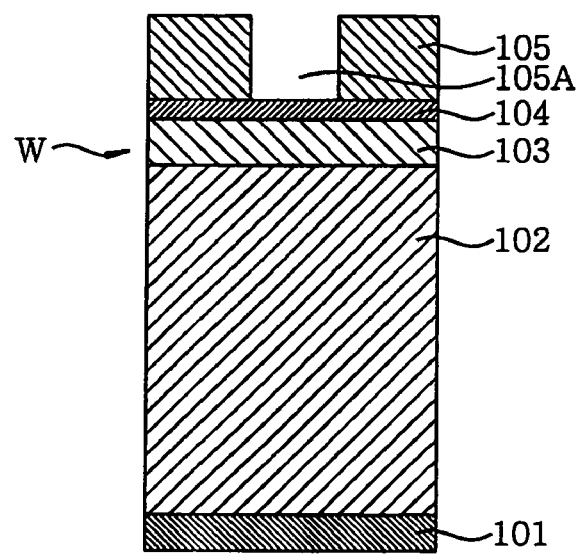
FIGS. 3A and 3B provide cross sectional views of principal parts of a wafer, which illustrate processes for etching the low-k film with the plasma processing apparatus of FIG. 1.
Figure 3B:
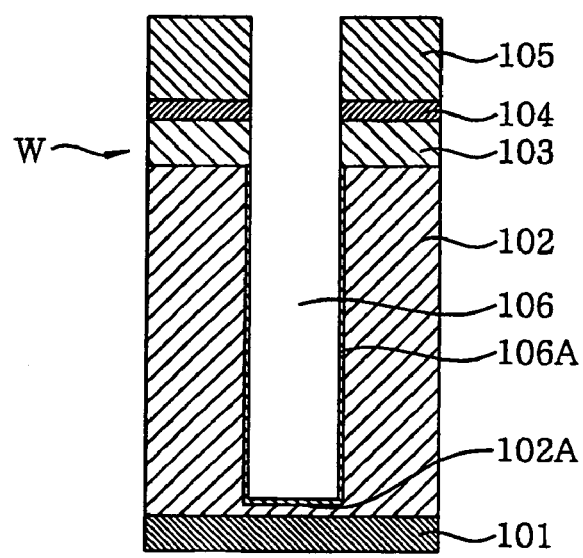

If an anisotropic etching is performed on the wafer W shown in FIG. 3A by using the resist film 105 as a mask under the aforementioned conditions, the anti-reflection coating 104, the hard mask 103 and the low-k film 102 are etched, thereby forming the opening 106 as illustrated in FIG. 3B. In this embodiment, the supply of $C_4F_8$ gas, Ar gas, and $N_2$ gas is suspended right before the underlayer 101 is about to be exposed and, then, the etching process is stopped. Accordingly, as shown in FIG. 3B, a part of the low-k film 102 remains to be left as the remaining film 102A on the underlayer 101. A film thickness of the remaining film 102A is preferably smaller than or equal to 100 nm, and, more preferably, it ranges from 30 nm to 50 nm. If it is smaller than 30 nm, a defective layer may be formed on the underlayer 101. On the contrary, if it is greater than 100 nm, the remaining film 102A may not be completely removed by an after-treatment followed by the etching process. Herein, the film thickness of the remaining film 102A can be managed by controlling, e.g., an etching time or the like.

When forming the opening 106 by etching the Low-K film 102, there are generally formed a defective layer 106A on the bottom surface and the sidewall surface of the opening 106.

However, in this embodiment, since the remaining film 102A is left above the underlayer 101, a defective layer is not formed on a surface of the underlayer 101. Instead, the defective layer 106A is formed on a surface of the remaining film 102A and on the sidewall surface of the opening 106. Accordingly, the defective layer 106A remains to be left inside the opening 106, it needs to be removed.

Accordingly, in this embodiment, after the etching process, a quality modification process is performed on the remaining film 102A of the low-k film 102 in the same plasma processing apparatus 1.

To be specific, the first to third gas sources 12A to 12C of the gas source 12 are switched off and instead, $O_2$ gas is supplied as a modifying gas at a specific flow rate from the fourth gas source 12D into the processing chamber 2. At this time, a flow rate of $O_2$ gas preferably ranges from 100 sccm to 300 sccm, for example. Further, the gas pressure inside the processing chamber 2 preferably ranges from 5 mTorr to 20 mTorr, for example. A high frequency power applied from the first high frequency power supply 6 preferably ranges from 100 W to 300 W, for example, whereas that applied from the second high frequency power supply 7 preferably ranges from 0 W to 300 W, for example. Other conditions remain to be same as those of the etching process.

If a plasma is generated from $O_2$ gas under the aforementioned conditions and, then, the oxygen plasma is applied onto the wafer W illustrated in FIG. 4A, a methyl group forming the remaining film 102A of the low-k film 102 reacts to oxygen and then is removed by the oxidation. Consequently, as depicted in FIG. 4B, the remaining film 102A of the low-k film 102 is modified into glass components $SiO_x$ including Si and O. After the quality modification process is completed, a liquid chemical processing is performed on the wafer W to thereby remove the modified portion of the wafer W.

Further, instead of oxygen gas, a gas mixture of $N_2$ and $H_2$ can be used as the modifying gas in modifying the remaining film 102A of the low-k film 102. In this case, a flow rate of $N_2$ gas preferably ranges from 0 sccm to 200 sccm, and that of $H_2$ gas preferably ranges from 200 sccm to 0 sccm, for example. Furthermore, the gas pressure inside the processing chamber 2 preferably ranges from 10 mTorr to 50 mTorr, for example. Each of high frequency powers applied from the first and the second high frequency power supply 6 and 7 preferably ranges from 100 W to 500 W, for example. Other conditions remain to be same as those of the etching process. Besides, before the quality modification process, the resist film 105 on the surface of the wafer W is removed by an ashing using an ashing apparatus (not shown).

Hereinafter, a method for removing the modified remaining film 102A of the low-k film 102 with the liquid chemical processor 20 will be described. In this embodiment, as for a liquid chemical, a solution containing at least one of hydrofluoric acid, ammonium fluoride, and tetramethyl ammonium hydroxide is preferably used. Hereinafter, there will be described a case of using a dilute hydrofluoric acid. Once the wafer W is supplied to the liquid chemical processor 20 by a transfer mechanism (not shown), the wafer chuck 21 thereof is elevated by the elevating mechanism 26 and then receives the wafer W in the liquid chemical processor 20.

Next, the wafer chuck 21 holding the wafer W is driven to rotate by the motor 22 at a high speed. In this state, if the dilute hydrofluoric acid is supplied through the nozzle 23B of the liquid chemical supply unit 23 to a top central surface of the wafer W, the dilute hydrofluoric acid reacts with the glass components of the remaining film 102A of the low-k film 102 and dissolve the glass components including mainly Si and O, resulting in a removal of the remaining film 102A of the low-k film 102.

At this time, a volume ratio between hydrofluoric acid and water in the dilute hydrofluoric acid used herein is 1:100, for example, and the processing is performed for 30 seconds to one minute. Since the dilute hydrofluoric acid does not react with SiC of the underlayer 101, the remaining film 102A is exclusively and completely removed without damaging the underlayer 101. Further, the defective layer 106A generated by the etching is also removed by the liquid chemical processing. After the processing, the dilute hydrofluoric acid containing $SiF_4$ is dispersed from the surface of the wafer W to thereby be collected in the ring-shaped receptacle 24 via the opening 24A. The collected liquid is discharged from the ring-shaped receptacle 24 through the exhaust line 24B of the ring-shaped receptacle 24.

As described above, this embodiment involves a first step of forming the opening 106 by etching the low-k film 102 until right before the underlayer 101 is about to be exposed by applying a plasma of an etching gas containing $C_4F_8$ through the resist film 105 having the opening 105A formed in a specific pattern, a second step of modifying a quality of the remaining film 102A of the low-k film 102 by applying the plasma of oxygen gas onto the remaining film 102A of the low-k film 102, and a third step of removing the modified remaining film 102A of the low-k film 102 with the dilute hydrofluoric acid.

Accordingly, the remaining film 102A of the low-k film 102 can be exclusively removed. Moreover, since the modified remaining film 102A of the low-k film 102 by the dilute hydrofluoric acid is removed by a wet etching process, a wet etching selectivity for the underlayer 101 becomes infinite. Accordingly, the opening 106 can be formed with high accuracy without damaging the surface of the underlayer 101. Therefore, even if the underlayer 101 and the low-k film 102 keeps getting thinner along with the trend for high density and high integration of a semiconductor device, the low-k film 102 can be exclusively etched without damaging the underlayer 101.

In this embodiment, there has been described a method for removing the modified remaining film 102A of the low-k film 102 through the wet etching by using a liquid chemical containing fluorine. However, as will be described hereinafter, the modified remaining film 102A of the low-k film 102 can also be removed by using apparatuses for performing a chemical oxide removal (COR) method illustrated in FIG. 5A (hereinafter, referred to as "COR apparatus") and a post heat treatment shown in FIG. 5B (hereinafter, referred to as "PHT apparatus")

Figure 5A:
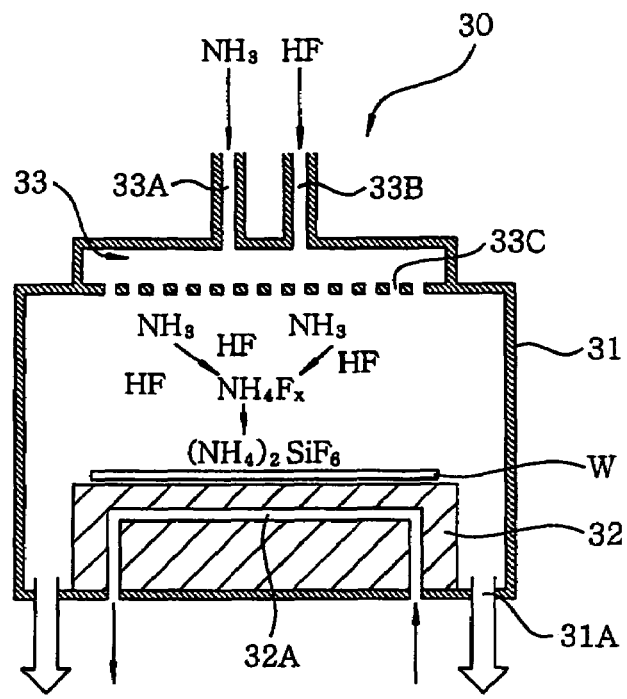
FIGS. 5A and 5B offer cross sectional views of an exemplary processing apparatus other than the liquid chemical processor used for removing the modified remaining film of the low-k film illustrated in FIG. 4C.

Specifically, as shown in FIG. 5A, a COR apparatus 30 includes a vacuum processing chamber 31, a mounting table 32 for the wafer W, disposed at a central portion of a bottom surface inside the processing chamber 31, and a shower head 33 provided at an upper ceiling of the processing chamber 31. The COR apparatus 30 performs a COR process for converting the modified remaining film 102A of the low-k film 102 of the wafer W on the mounting table 32 into volatile chemical compounds by using a processing gas supplied through the shower head 33 into the processing chamber 31. The COR process is a dry etching process using no plasma. To be specific, the modified remaining film 102A of the low-k film 102 is converted into volatile chemical compounds due to a chemical reaction with a processing gas to be removed thereafter, wherein no plasma is generated from the processing gas.

As shown in FIG. 5A, an evacuation port 31A formed on a bottom surface of the processing chamber 31 is provided at an outer portion of the mounting table 32. After the treatment, the gas is discharged to the outside through the evacuation port 31A. An electrostatic chuck (not shown) is provided on a top surface of the mounting table 32, and a coolant channel 32A for circulating a coolant is formed therein. Further, a first gas supply line 33A and a second gas supply line 33B are formed on a top surface of the shower head 33, and a plurality of gas injection openings 33C are formed on a bottom surface of the shower head 33, i.e., on an upper wall of the processing chamber 31. Accordingly, the shower head 33 supplies a processing gas introduced from the first and the second gas supply line 33A and 33B into the processing chamber 31 through the gas injection openings 33C.

As for the processing gas, a gas mixture of ammonia gas and hydrogen fluoride gas, for example, is preferably used as shown in FIG. 5A. Moreover, an Ar gas may be added thereto. Herein, it is preferable to set a flow rate of the ammonia gas to be greater than that of the hydrogen fluoride gas. For example, a flow rate (sccm) ratio of the ammonia gas to the hydrogen fluoride gas is preferably in the range of 1:1 to 2:1. Further, a pressure of the gas mixture inside the processing chamber 31 preferably ranges from 10 mTorr to 40 mTorr. A temperature of the mounting table 32 is preferably set to be kept at 25° C., for example. As will be shown in a following chemical formula, by performing the COR process in which the aforementioned gases react with the glass components $SiO_2$ of the modified remaining film 102A of the low-k film 102 of the wafer W, a volatile gas component and volatile complex compound $(NH_4)_2SiF_6$. are generated.

$SiO_2 + 4HF \rightarrow SiF_4 + 2H_2O\uparrow$ 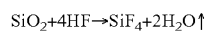

$SiF_4 + 2NH_3 + 2HF \rightarrow (NH_4)_2SiF_6$  [COR process]

Figure 5B:
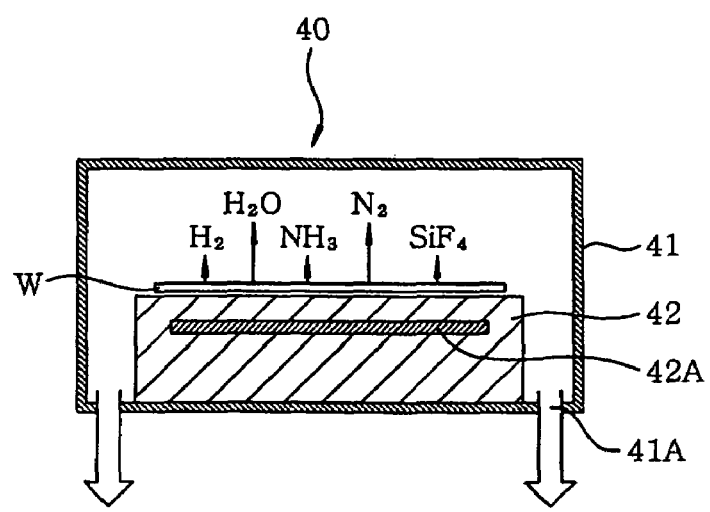

Meanwhile, as illustrated in FIG. 5B, a PHT apparatus 40 includes a processing chamber 41 and a mounting table 42 for accommodating therein a heater 42A and performs a PHT process by heating a wafer W that has been subjected to the COR process. Accordingly, as depicted in the following chemical formula of the PHT process, the volatile complex compound is thermally decomposed into volatile gas components to be completely volatilized and, then, removed from the wafer W. In addition, an evacuation port 41A formed on a bottom surface of the processing chamber 41 is provided at an outer portion of the mounting table 42. The volatilized gas compounds are discharged by supplying a predetermined gas (e.g., unreactive gas such as nitrogen gas or the like) through a shower head (not shown).

The wafer W is preferably heated in the range of 80° C. to 200° C., for example. Further, a processing time of the wafer W preferably ranges from 60 seconds to 180 seconds, and a gas pressure inside the processing chamber 41 preferably ranges from 500 mTorr to 1 Torr, for example. A flow rate of the unreactive gas such as a nitrogen gas or the like preferably ranges from 500 sccm to 3000 sccm, for example. Moreover, as shown in FIG. 5B, during the PHT process, $N_2$ and $H_2$ are slightly volatilized in addition to following volatile compounds.

$(NH_4)_2SiF_6 \rightarrow SiF_4\uparrow + 2NH_3\uparrow + 2NF\uparrow$  [PHT process]

As described above, in accordance with this embodiment, the COR process and the PHT process are sequentially performed in removing the modified remaining film 102A of the low-k film 102. Accordingly, the modified remaining film 102A of the low-k film 102 is converted into the chemical compounds to be volatilized and, then completely removed. As a result, a surface of the underlayer 101 can be exposed without being damaged.

The present invention is not limited to the aforementioned embodiment. Although the aforementioned embodiment has described a case where the hard mask 103, the anti-reflection coating 104 and the resist film 105 are laminated on the low-k film 102, the present invention can also be applied to a case where the anti-reflection coating 104 and the resist film 105 are removed and, then, an etching is performed by using the hard mask 103 as a mask.

That is, the present invention includes the method of forming the opening 106 by etching the insulation film 102 until just before the underlayer 102 is about to be exposed, modifying a quality of the remaining film 102A thereof on a bottom surface of the opening 106 by applying a plasma of an additional gas other than the etching gas, and removing the modified portion with a liquid chemical. In addition, instead of a wet etching method, the present invention includes a dry etching method using no plasma, e.g, the COR process, and then removing a modified remaining film 102A.

The present invention is suitable for an etching method for etching an insulation film to form an opening.

In accordance with the present invention, there can be provided an etching method capable of etching an insulation film exclusively with high accuracy without damaging the underlayer even while the wafer keeps getting thinner along with the trend for high density and high integration of a semiconductor device.

While the invention has been shown and described with respect to the preferred embodiments, it will be understood by those skilled in the art that various changes and modification may be made without departing from the scope of the invention as defined in the following claims.

What is claimed is:

1. A method for etching an insulation film through a patterned mask, comprising:
    a first process of etching the insulation film until an underlayer is about to be exposed by applying a first plasma of a first processing gas, leaving a bottom portion of the insulation film unetched;
    a second process of modifying a quality of the bottom portion of the insulation film by applying a second plasma of a second processing gas, the second plasma being different from the first plasma; and
    a third process of removing the bottom portion of the insulation film having a modified film quality with a liquid chemical, wherein the insulation film is formed of a single layer.

2. A method for etching an insulation film through a patterned mask, comprising:
    a first process of etching the insulation film until an underlayer is about to be exposed by applying a first plasma of a first processing gas, leaving a bottom portion of the insulation film unetched;
    a second process of modifying a quality of the bottom portion of the insulation film by applying a second plasma of a second processing gas, the second plasma being different from the first plasma; and
    a third process of removing the bottom portion of the insulation film having a modified film quality through a dry etching process using no plasma, wherein the insulation film is formed of a single layer.

3. The method of claim 1, wherein the insulation film is a SiCOH-based low dielectric constant insulation film.

4. The method of claim 2, wherein the insulation film is a SiCOH-based low dielectric constant insulation film.

5. The method of claim 1, wherein the mask includes a hard mask.

6. The method of claim 2, wherein the mask includes a hard mask.

7. The method of claim 1, wherein the first processing gas is fluorocarbon gas.

8. The method of claim 2, wherein the first processing gas is fluorocarbon gas.

9. The method of claim 3, wherein in the second process, a methyl group is mainly removed from the SiCOH-based low dielectric constant insulation film.

10. The method of claim 1, wherein the second processing gas contains at least $H_2$ gas or $O_2$ gas.

11. The method of claim 2, wherein the second processing gas contains at least $H_2$ gas or $O_2$ gas.

12. The method of claim 1, wherein the liquid chemical contains at least one of hydrofluoric acid, ammonium fluoride and tetramethyl ammonium hydroxide.

13. The method of claim 2, wherein the dry etching process using no plasma employs a chemical oxide removal method.

14. The method of claim 1, wherein the underlayer is formed of SiC or SiCN.

15. The method of claim 2, wherein the underlayer is formed of SiC or SiCN.

16. A method for etching a SiCOH-based low dielectric constant insulation film, comprising:
    a first process of etching the SiCOH-based low dielectric constant insulation film with a fluorocarbon gas plasma without exposing an underlayer such that a thickness of a remaining film formed of an unetched bottom portion of the SiCOH-based low dielectric constant insulation film is smaller than or equal to 100 nm;
    a second process of removing a methyl group from the remaining film by applying a plasma containing $H_2$ gas or $O_2$ gas; and
    a third process of removing the remaining film devoid of the methyl group with a solution containing at least one of hydrofluoric acid, ammonium fluoride and tetramethyl animonium hydroxide, wherein the insulation film is formed of a single layer.

17. A method for etching an insulation film through a patterned mask, comprising:
    a first process of etching the insulation film until an underlayer is about to be exposed by applying a first plasma of a first processing gas, leaving a bottom portion of the insulation film unetched;
    a second process of modifying a quality of the bottom portion of the insulation film by applying a second plasma of a second processing gas, the second plasma being different from the first plasma; and
    a third process of removing the bottom portion of the insulation film having a modified film quality, wherein the insulation film is formed of a single layer.

18. The method of claim 1, wherein the second processing gas contains $H_2$ gas.

* * * * *